US009092590B2

(12) United States Patent
Giraud et al.

(10) Patent No.: US 9,092,590 B2
(45) Date of Patent: Jul. 28, 2015

(54) METHOD FOR GENERATING A TOPOGRAPHY OF AN FDSOI INTEGRATED CIRCUIT

(71) Applicants: Commissariat a l'energie atomique et aux energies alternatives, Paris (FR); STMicroelectronics SA, Montrouge (FR)

(72) Inventors: Bastien Giraud, Grenoble (FR); Philippe Flatresse, Lapierre (FR); Matthieu Le Boulaire, Saint Martin le Vinoux (FR); Jean-Philippe Noel, Montbonnot Saint Martin (FR)

(73) Assignees: Commissariat a l'energie atomique et aux energies alternatives, Paris (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 14/105,382

(22) Filed: Dec. 13, 2013

(65) Prior Publication Data

US 2014/0173544 A1    Jun. 19, 2014

(30) Foreign Application Priority Data

Dec. 13, 2012    (FR) ..................................... 12 61980

(51) Int. Cl.
G06F 17/50       (2006.01)
H01L 21/84       (2006.01)

(52) U.S. Cl.
CPC ........ *G06F 17/5072* (2013.01); *G06F 17/5068* (2013.01); *G06F 17/5077* (2013.01); *H01L 21/84* (2013.01)

(58) Field of Classification Search
CPC ... G01F 1/68; G06F 17/5068; G06F 17/5072; G06F 17/5077; H01L 21/84
See application file for complete search history.

(56) References Cited

U.S. PATENT DOCUMENTS 8,293,615 B2 *   10/2012  Cheng et al. .................. 438/353
2014/0030838 A1 *  1/2014  Cai et al. ......................... 438/49

FOREIGN PATENT DOCUMENTS

WO    WO2012/160071    11/2012

OTHER PUBLICATIONS

"32nm and Beyond Multi-Vt Ultra-Thin Body and BOX FDSOI: From Device to Circuit", by O. Thomas et al. , @2010, IEEE.*

(Continued)

*Primary Examiner* — Nha Nguyen
(74) *Attorney, Agent, or Firm* — Occhiuti & Rohlicek LLP (57) ABSTRACT

An IC including first and second FDSOI UTBOX cells arranged in a row, the first having an nMOS transistor arranged plumb with and above a ground plane and an N-type well, and a pMOS transistor arranged plumb with and above a ground plane and a P-type well, the N-type well and the P-type well being arranged on either side of a row axis, wherein the second includes a diode protecting against antenna effects or a well tap cell, the second cell comprising a P-type well arranged in the alignment of the P-type well of the pMOS transistor and comprising an N-type well arranged in the alignment of the N-type well of the nMOS transistor, the second cell comprising a metal connection coupled to its P-type well and coupled to a higher-level metal connection element arranged plumb with the N-type well, the metal connection extending on either side of the axis.

10 Claims, 4 Drawing Sheets

(56) References Cited

OTHER PUBLICATIONS

Pelloie "FDSOI Design Portability from Bulk at 20nm Node" IEEE SOI Conference Oct. 4, 2011 pp. 1-30.

Noel et al. "Multi-$V_t$ UTBB FDSOI Device Architectures for Low-Power CMOS Circuit"; IEEE Transactions on Electrons Devices; 58(8):2473-2482 (2011).

* cited by examiner

500 - standard cells are automatically placed in a row of the integrated circuit topography.

502 - the automatic routing of the standard cells placed in step 500 is carried out.

504 - the standard cell of the protection diode or of the well tap cell is automatically replaced with a specific standard cell.

506 - the automatic inversion of the doping type of the wells of the standard transistor cell and the standard cell of the protection diode or of the well tap cell is carried out.

508 - the digital topography of the etching masks is generated according to an FDSOI UTBOX technology for the manufacture of the integrated circuit.

METHOD FOR GENERATING A TOPOGRAPHY OF AN FDSOI INTEGRATED CIRCUIT

RELATED APPLICATIONS

Under 35 USC 119, this application claims the benefit of the priority date of French Application No. 1261980, filed on Dec. 13, 2012, the contents of which are herein incorporated by reference.

FIELD OF DISCLOSURE

The invention relates to integrated circuits, and in particular integrated circuits implemented on a silicon-on-insulator (SOI) substrate. SOI technology consists in separating a thin layer of silicon (a few nanometers) on a silicon substrate by means of a relatively thick layer of insulator (several tens of nanometers as a general rule).

BACKGROUND

Integrated circuits implemented in SOI technology offer a certain number of advantages. Such circuits generally have lower power consumption for equivalent performance. Such circuits also cause lower parasitic capacitances, thereby improving switching speed. Furthermore, the latchup phenomenon encountered by CMOS transistors in bulk technology can be avoided. Such circuits are therefore particularly suitable for SOC or MEMS applications. It is also noted that SOI integrated circuits are less sensitive to the effects of ionizing radiation and are thus more reliable in applications where such radiation can cause operating problems, notably in space applications. SOI integrated circuits can notably include SRAM memories or logic gates.

The reduction of the static consumption of logic gates while increasing their switching speed is the subject of many studies. Some integrated circuits currently under development simultaneously integrate low-consumption logic gates and logic gates with a high switching speed. In order to generate these two types of logic gates on the same integrated circuit, the threshold voltage of some transistors of the fast-access logic gates is lowered, and the threshold voltage of other transistors of the low-consumption logic gates is increased. In bulk technology, the modulation of the threshold voltage level of transistors of the same type is carried out by differentiating the doping level of their channel. However, in FDSOI (Fully Depleted Silicon On Insulator) technology, the doping of the channel is more or less zero ($10^{15}$ cm$^{-3}$). Thus, the doping level of the channel of the transistors cannot therefore reveal substantial variations, which prevents the threshold voltages from being differentiated in this way. One solution proposed in some studies for implementing transistors of the same type with different threshold voltages is to integrate different gate materials for these transistors. However, the practical implementation of an integrated circuit of this type proves technically challenging and economically prohibitive.

In order to have different threshold voltages for different transistors in FDSOI technology, it is also known to use a biased ground plane arranged between a thin insulating oxide layer and the silicon substrate (known as UTBOX technology). By adjusting the doping and biasing of the ground planes, a range of threshold voltages can be defined for the different transistors. This will therefore provide low threshold voltage transistors, known as LVT (typically 400 mV), high threshold voltage transistors, known as HVT (typically 550 mV), and medium threshold voltage transistors, known as SVT (typically 450 mV).

Some publications have proposed developments of the structures of FDSOI integrated circuits. A practical problem that arises with any technological development relating to circuits of this type is that existing design tools may prove to be incompatible or may require substantial computing developments.

Thus, in the industry, the designers of electronic circuits for the manufacturers of semiconductors use computer-assisted design (CAD). Large circuits are in fact too complex to be designed manually and require appropriate computing tools, notably to avoid the risks of design errors. In fact, for current technological nodes, many parameters must be taken into account to avoid malfunction or destruction of the circuits. CAD uses a functional input specification. This functional specification describes the desired function of the circuit, as well as non-functional constraints (surface area, cost, power consumption, etc.). CAD provides a representation in the form of an output computer file (generally in GDSII or, more recently, OASIS format). This computer file defines the drawings of the masks of the integrated circuit to be implemented, in such a way that these masks can be manufactured. The masks that are produced are then used for the production of the circuit in the semiconductor production units during photolithography steps. CAD is divided up into a plurality of steps.

Starting with the functional specification of the circuit, the design and overall architecture of the integrated circuit are defined during a first step. The complete system (hardware and software) is thus modeled at a very high level in order to validate the performance of the chosen architecture in relation to the requirements of the application. The architecture of the integrated circuit is generally designed in Verilog, VHDL, SPICE or other languages.

An optimization step is then carried out (known as floor-planning) This step entails the creation of a map of the placements of the logic gates on the chip, the sources and bondings, the inputs/outputs, and the macro circuits (complex components such as the processors, DSP, memories, etc.).

A logical synthesis of the circuit is then carried out. In this step, the circuit is modeled at Register Transfer Level (RTL). This modeling describes the implementation of the integrated circuit in the form of sequential elements and logical combinations between the different inputs/outputs of the sequential elements and primary inputs/outputs of the integrated circuit. The modeling provides a network made up of logic gates and rudimentary elements. This modeling is generally coded with a dedicated language such as Verilog or VHDL. RTL modeling is automatically synthesizable into combinatorial (AND, OR, multiplexer gates, etc.) and sequential (synchronous D flip-flops, etc.) logic gates originating from a standard cell library. The placement of the elements is not yet specified at this stage and occurs in the form of a list of elements necessary for performing the desired functions.

A circuit behavioral synthesis, also known as a high-level synthesis or algorithmic synthesis, is then carried out. The time behavior of the generated RTL model is then simulated. Each interconnection signal is determined according to described input stimuli (generally in the same language as the RTL model). If the circuit to be simulated contains a processor, a corresponding executable program is defined in the form of binary memory content. The memory containing the program code and data (FLASH or SRAM, for example) can also be modeled with the same language, but at a higher level of abstraction than the RTL.

The algorithmic synthesis is not necessarily enough to guarantee the absence of design errors for the following reasons, since:
- the generation of the stimuli is carried out by the designer and does not allow exhaustive functional tests to be carried out for reasons of time;
- the logical simulators are relatively slow. For a complex circuit, several days of simulation may be necessary, which limits the number of simulations that can be carried out.

During a logical synthesis step, the RTL model of the circuit is transformed into a description at the logic gates level (generation of the gate netlist). A library of available logic ports is provided for this purpose. This library generally provides a collection of several hundred logic elements (such as AND, OR, flip-flop gates, etc.). This library depends on the etching fineness of the circuit (for example 32 nm or 22 nm) and the cell drawing rules according to the production process of the manufacturer.

The user must also provide logical synthesis constraints, such that the operating frequency of the circuit, its conditions (supply voltage range, temperature range, spread of the gate transit times linked to the production process), the departure and arrival time constraints on the primary and secondary inputs of the circuit, the load model linked to the interconnection wires that will connect the gates or the maximum size of the circuit on the silicon substrate.

The synthesis tools generally work on synchronous digital integrated circuits of which the sequential elements are timed by a single clock. There may possibly be a plurality of clock domains, combining a set of sequential and combinatorial elements. The logical synthesis tool of a synchronous circuit generally proceeds in a plurality of steps:
- transformation of the RTL model into generic combinatorial and sequential logical elements (independently from the target library) according to mathematical algorithms;
- replacement of the generic logical elements with those originating from the target library. For this purpose, it chooses logical elements observing the constraints of time and space given by the user. Transit time analysis calculations are then carried out on all of the logical paths of the circuit in order to make sure that they observe the time constraints (operating frequency of the circuit). If the results are not conclusive, the tool attempts to use other ports available in the library to achieve the required result. It is thus customary in a library to have many ports performing the same logical function but with different sizes and fan-outs;
- when the time constraints are observed, the synthesis tool has some time margins on some paths. It can then optimize the design of the circuit by replacing some gates with others that have lower requirements in terms of power consumption and silicon size, while continuing to observe the time constraints.

The logical synthesis provides a computer file representing the instantiation of the gates of the target library and their interconnection and representing the integrated circuit (gate netlist). Different formats of this type of representation exist, notably the Verilog format, the VHDL format or the EDIF format.

The logical synthesis is followed by a place and route step. During this step, the different components of the integrated circuit defined in the gate netlist are automatically placed and connected according to the problem to be solved. The place and route process is a difficult optimization problem that requires metaheuristic techniques. The place and route step is then followed by the generation of the topography of the etching masks. During the logical synthesis of a circuit in UTBOX-FDSOI technology, in order to have as little impact as possible on the design process and the CAD tools already available, it is known to carry out a step of placing and routing of standard cells selected from a library including Bulk technology components. Automated transformations are then carried out following this place and route step, to convert the circuit defined in Bulk technology into a circuit in UTBOX-FDSOI technology. An automated transformation of this type can notably be carried out following the place and route step, in order to proceed with the generation of the topography of the etching masks, wherein a large number of parameters of the standard cells may be identical in Bulk technology or in UTBOX-FDSOI technology.

The logical synthesis of the circuit in UTBOX-FDSOI technology may also be carried out with a step of placing and routing of standard cells selected from a library directly including UTBOX-FDSOI components.

The standard cells of such a library include for the most part a pair of an nMOS transistor and a pMOS transistor implemented in an upper layer of silicon. This silicon layer overhangs an insulating oxide layer, of so-called ultrafine thickness, typically less than 50 nm. A ground plane or rear gate is disposed under the oxide layer of the nMOS and a ground plane or back gate is disposed under the oxide layer of the pMOS. Each ground plane is biased via a respective well passing under a deep isolation trench. The threshold voltage of the transistors is adjusted notably by applying appropriate biasing voltages to the wells. In order to increase the possibilities for adjusting the threshold voltages, the doping of the ground plane can be of the N-type or P-type, for either the nMOS transistor or the pMOS transistor. The ground planes of the pMOS transistors are biased by an N-type doping well. The ground planes of the nMOS transistors are biased by a P-type doping well. Such an association of the wells and transistors will be referred to below as PPNN.

Moreover, while the well of the pMOSs is normally biased to a voltage Vdd and the well of the nMOSs is normally biased to a voltage Gnd, these voltages may be modulated to adapt the threshold voltages of the transistors. An FBB (Forward Back Biasing) may notably be applied. Such a biasing consists in applying Gnd+$\Delta$V to the well of the nMOSs and Vdd-$\Delta$V to the well of the pMOSs. In use, the applied voltage variation $\Delta$V is limited. In fact, $\Delta$V is kept below a value Vdd/2 in order to avoid a diode junction leading directly between the P-type well and the N-type well.

To enable a greater value of $\Delta$V (and thus lower the threshold voltage in order to increase the switching speed of some transistors), it has been proposed to bias the ground planes of the pMOSs by means of P-type doping wells, and to bias the ground planes of the nMOSs by means of N-type doping wells. Such an association of the wells and transistors will be referred to below as PNNP. However, while the PPNN association enables the relatively simple generation of the topography of the circuit through the automation of modifications of a topography originating from the placing and routing of standard Bulk cells, the same does not apply to a PNNP association.

If a placing and routing of standard Bulk cells or PPNN is then simply carried out, and the dopings of the wells of all standard cells envisaged during the generation of the topography of the masks are automatically inverted, a certain number of non-functional standard cells will then occur. The repetition cells (referred to as "well tap" cells) and the diodes protecting against the antenna effects (diodes of this type are notably referred to by the term "diode antenna", in order to protect against the charge accumulation phenomenon during the manufacturing process referred to as the "antenna effect") cannot thus operate correctly with a simple inversion of the doping of their well. With the biases applied to their well, the well tap cells would form directly biased diodes. The protection diodes would no longer form a diode and would be non-functional.

To generate the topography of the masks, the designer must then replace these standard cells with specific standard cells, then restart a place and route step to adapt the interconnections of these standard cells with higher-level metal lines or move some standard cells.

However, a new place and route step is long and laborious and prolongs the duration of the circuit design process. Consequently, the generation of a topography of PNNP masks is clearly more laborious than the generation of a topography of PPNN masks.

SUMMARY

The invention aims to resolve one or more of these disadvantages. The invention thus relates to a method for generating a digital integrated circuit topography, including the steps of:
- automatic placement of the standard cells in at least one row of the topography of the integrated circuit, said standard cells including at least:
- a first standard cell including an nMOS transistor disposed perpendicular to a P-type doping well, and including a pMOS transistor disposed perpendicular to an N-type doping well, the P-type well and the N-type well being arranged on either side of an axis of the row; and
- a second standard cell including a diode protecting against antenna effects or a well tap cell, said second cell comprising a P-type doping well arranged in the alignment of the P-type well of the nMOS transistor and comprising an N-type doping well arranged in the alignment of the N-type well of the pMOS transistor, the second cell comprising a lower metal connection element coupled to its P-type doping well;
- automatic routing of the placed standard cells, the routing including the creation of an interconnection between the lower metal connection element and an upper metal connection element arranged perpendicular to the lower metal connection element;
- replacement of the second standard cell with a third standard cell comprising a P-type doping well arranged in the alignment of the P-type well of the nMOS transistor and comprising an N-type doping well arranged in the alignment of the N-type well of the pMOS transistor, the third cell comprising a lower metal connection element extending on either side of said axis and coupled to the N-type doping well and coupled to the upper metal connection element;
- automatic inversion of the doping type of the wells of said first and third standard cells;
- generation of a digital topography of etching masks for the manufacture of an FDSOI UTBOX integrated circuit including the first and third standard cells having been subjected to the automatic doping inversion.

According to one alternative, the topography generation step includes the generation of etching masks for the formation of a UTBOX insulating layer under the nMOS and pMOS transistors and for the formation of respective ground planes between the layer of insulator and the wells of the nMOS and pMOS transistors, the doping type of each of these ground planes being the opposite of the doping type of the well of its transistor. According to a different alternative, said first and second standard cells are of the FDSOI UTBOX type.

According to a different alternative:
- said second standard cell is a well tap cell comprising a different lower metal connection element interconnected to its N-type doping well;
- the routing includes the creation of an interconnection between the different lower metal connection element and a different upper metal connection element arranged perpendicular to the different lower metal connection element;
- the third well tap or replacement cell comprises a different lower metal element extending on either side of said axis and interconnected to the P-type doping well and interconnected to the upper metal connection element.

According to another alternative, said second standard cell is a protection diode.

According to another different alternative, the automatic inversion is preceded by the inclusion of an automatic inversion marker in the first and third standard cells.

The invention also relates to an integrated circuit including first and second FDSOI UTBOX cells disposed in a row, in which:
- the first cell includes an nMOS transistor arranged plumb with and above a ground plane and an N-type doping well, and including a pMOS transistor arranged plumb with and above a ground plane and a P-type doping well, the N-type well and the P-type well being arranged on either side of an axis of the row;
- the second cell includes a diode protecting against antenna effects or a well tap cell, said second cell comprising a P-type doping well arranged in the alignment of the P-type well of the pMOS transistor and comprising an N-type doping well arranged in the alignment of the N-type well of the nMOS transistor, the second cell comprising a lower metal connection element coupled to its P-type doping well and coupled to a higher-level metal connection element arranged plumb with the N-type doping well, the lower metal connection element extending on either side of said axis.

According to one alternative, the integrated circuit includes a biasing circuit configured to apply a voltage to the N-doped well of the nMOS transistor and to apply a voltage to the P-doped well of the pMOS transistor, the voltage applied to the N-doped well being higher than the voltage applied to the P-doped well.

According to another alternative, the ground plane of the nMOS transistor has a P-type doping and the ground plane of the pMOS transistor has an N-type doping.

According to a different alternative, the lower metal connection element is coupled to its P-type doping well by a via and by an N-type doping layer and of which the doping level is higher than that of the ground planes of the nMOS and pMOS transistors.

DESCRIPTION OF THE FIGURES

Other characteristics and advantages of the invention will become clearly evident from the description that follows, by way of indication and in no way limiting, with reference to the drawings, in which.

DETAILED DESCRIPTION

In the context of the design of FDSOI-UTBOX integrated circuits with an FBB type biasing, the invention aims to simplify the generation of a topography of masks when nMOS transistors are intended to overhang an N-type well and when pMOS transistors are intended to overhang a P-type well. The invention proposes to replace standard cells of well tap cells or of diodes protecting against antenna effects with newly defined standard cells, before proceeding with an inversion of the doping types of a set of wells. In these new standard cells, a metal connection element extends on either side of the axis of a row of cells, i.e. plumb with both the N-type well and the P-type well of the standard cell. The metal connection element is interconnected to an N-type well before the inversion of the doping types.

The performance of a place and route step after the inversion of the doping types of the wells can thus be avoided. In fact, once the routing has been carried out with a first set of standard cells, the modifications made to the standard cells of the well tap cell type or diode type protecting against antenna effects have no impact on the definition of the interconnections with the metal connection elements in the higher levels. Optimized integrated circuits can thus be generated through a relatively simple adaptation of the design processes used in Bulk technology or for PPNN topographies.

Figure 1:
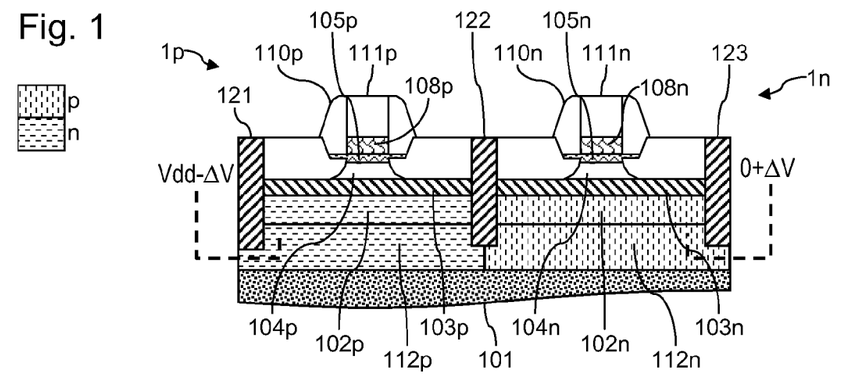
FIG. 1 is a cross-section view of a cell including transistors according to a PPNN topography.

FIG. 1 shows an example of a cell including a pair of transistors nMOS 1n and pMOS 1p. The transistors 1n and 1p are implemented in FDSOI technology, according to a PPNN topography. The transistors 1n and 1p are implemented on a silicon substrate layer 101. The transistors 1n and 1p include respective buried insulating layers 103n and 103p, separated from the substrate layer 101 via respective ground planes 102n and 102p and wells 112n and 112p. The insulating layers 103n and 103p are topped by an active silicon layer. The active silicon layer of the transistor 1n comprises a source, a channel 104n and a drain. The active silicon layer of the transistor 1p comprises a source, a channel 104p and a drain. The ground planes 102n and 102p improve the electrostatic control of the transistor by limiting the penetration of the electrical fields generated by the drain and the source under the channel 104n or 104p.

The reduction of the lateral electrostatic coupling reduces the short-channel effects and limits the effect of depletion by the drain DIBL. The channels 104n and 104p are covered by gate oxide layers 105n and 105p respectively. The gate oxides 105n and 105p are topped by respective gate stacks including metal layers 108n and 108p and polysilicon layers 111n and 111p. The stacks are laterally delimited by spacers 110n and 110p. Isolation trenches 121, 122 and 123 are placed around the transistors 1n and 1p.

In order to control the threshold voltage of the transistors, the insulating layers 103n and 103p have a so-called ultra-fine thickness, typically between 10 and 100 nm.

The ground planes 102n and 102p are biased via the wells 112n and 112p respectively. The ground planes of the transistors 1n and 1p shown have an FBB (Forward Back Biasing). Instead of being biased to ground, the ground plane 102n is biased to 0+ΔV. Instead of being biased to Vdd, the ground plane 102p is biased to Vdd-ΔV.

The ground plane 102n has a P-type doping and the ground plane 102p has an N-type doping. The wells 112n and 112p have respective P-type and N-type dopings. The biasing of the ground planes 102n and 102p is effected by well tap cells (not shown) via the wells 112n and 112p respectively.

Standard cells of this type are unsuitable when ΔV>Vdd/2 since the voltage of the well 112n is then higher than the voltage of the well 112p, resulting in the formation of a directly biased diode. Standard cells of this type are therefore incompatible with such a biasing of the ground plans, known as FFBB (Full Forward Back Biasing). A biasing of this type is intended to lower the threshold voltage of the transistors 1n and 1p and therefore increase their speed for some applications.

A circuit of this type also comprises standard cells of diodes protecting against antenna effects and/or well tap cells coupled to standard transistor cells of this type. A standard cell of a protection diode or of a well tap cell is thus coupled in the same row to a standard transistor cell. The standard cell of a protection diode or of a well tap cell thus comprises an N-type doping well arranged in the alignment of the N-type doping well of a coupled transistor, and a P-type doping well arranged in the alignment of the P-type doping well of a coupled transistor.

Figure 3A:
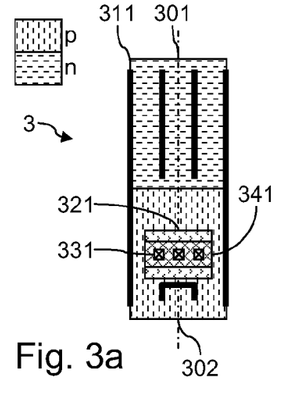
FIGS. 3a and 3b are top views of an example of a standard cell of a protection diode for a PPNN topography.
Figure 3B:
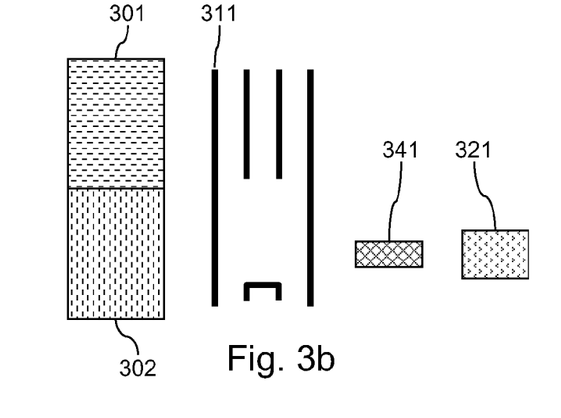
Figure 4:
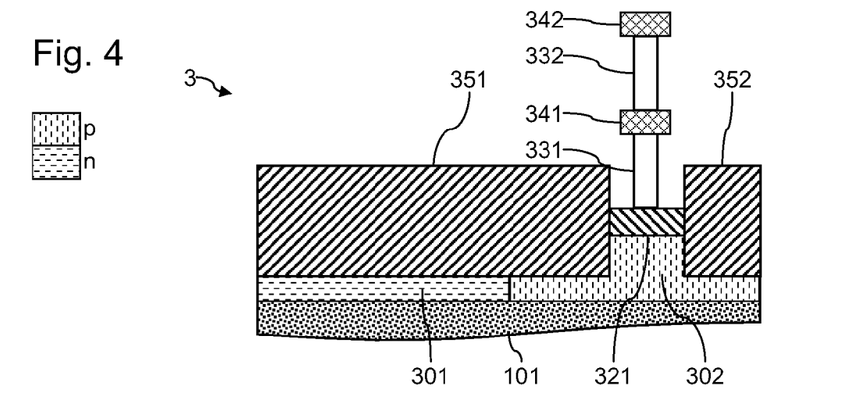
FIG. 4 is a cross-section side view of the standard cell shown in FIG. 3.

FIG. 3a shows a top view of a standard cell of a protection diode 3 according to a PPNN topography. FIG. 3b shows a top view of different layers of a standard cell of this type. FIG. 4 is a cross-section view of a standard cell of this type. A standard cell of this type is intended to be coupled to a standard transistor cell as shown in FIG. 1. The standard diode cell 3 thus comprises an N-type doping well 301 and a P-type doping well 302. The well 301 is in contact with the well 302 on an axis corresponding to the axis of a row of standard cells. The patterns 311 correspond to polysilicon. A biasing element 321 is arranged plumb with the well 302 and forms an electrical connection with this well 302. The biasing element 321 comprises an N-type doping layer (arranged more or less at the same depth as the ground plane of an adjacent transistor and having a doping typically higher than that of this ground plane). The biasing element 321 may also comprise an upper layer of NiSi to carry out a silicidation step. The standard cell 3 also comprises a lower metal connection element 341, arranged plumb with the biasing element 321 and the well 302. The lower metal connection element 341 is electrically connected to the biasing element 321 via one or more holes 331. The biasing element 321 is transversely isolated via isolation trenches 351 and 352.

The lower metal connection element 341 is connected to an upper metal connection element 342 via a hole 332. The upper metal connection element 342 is introduced into the digital topography of the circuit during a routing step.

Figure 7A:
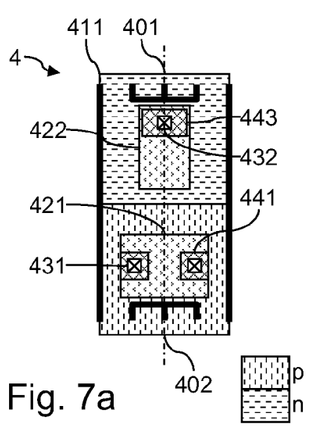
FIGS. 7a and 7b are top views of an example of a standard cell of a well tap cell for a PPNN topography.
Figure 7B:
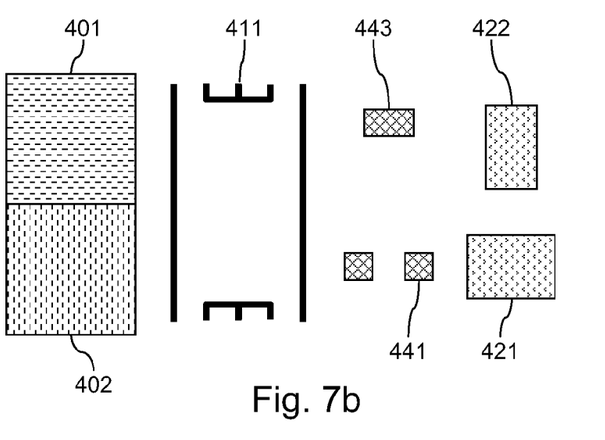
Figure 8:
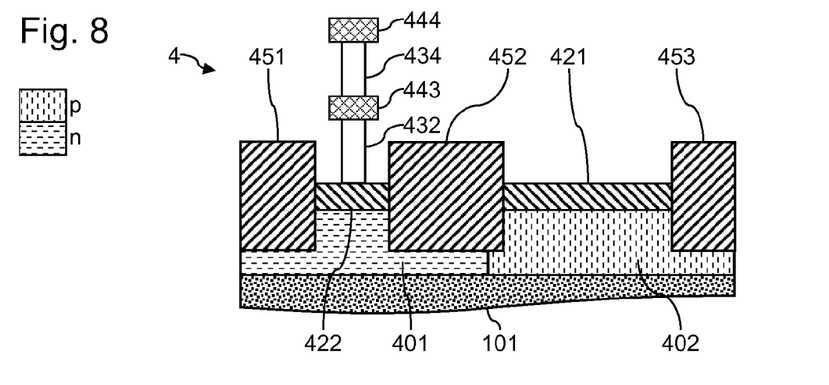
FIG. 8 is a cross-section side view of the standard cell shown in FIG. 7.

FIG. 7a shows a top view of a standard cell of a well tap cell according to a PPNN topography. FIG. 7b shows a top view of different layers of a standard cell of this type. FIG. 8 is a cross-section view of a standard cell of this type. A standard cell of this type is intended to be coupled to a standard transistor cell as shown in FIG. 1.

The standard cell of well tap cells 4 thus comprises an N-type doping well 401 and a P-type doping well 402. The well 401 is in contact with the well 402 on an axis corresponding to the axis of a row of standard cells. The patterns 411 correspond to polysilicon. A biasing element 421 is arranged plumb with the well 402 and forms an electrical connection with this well 402. A biasing element 422 is arranged plumb with the well 401 and forms an electrical connection with this well 401. The biasing element 421 comprises an N-type doping layer (arranged more or less at the same depth as the ground plane of an adjacent transistor and having a doping typically higher than that of this ground plane). The biasing element 421 may also comprise an upper layer of NiSi to carry out a silicidation step. The biasing element 422 comprises an N-type doping layer (arranged more or less at the same depth as the ground plane of an adjacent transistor and having a doping typically higher than that of this ground plane). The biasing element 422 may also comprise an upper layer of NiSi to carry out a silicidation step. The standard cell 4 also comprises a lower metal connection element 441, arranged plumb with the biasing element 421 and the well 402. The lower metal connection element 441 is electrically connected to the biasing element 421 via one or more holes 431. The standard cell 4 also comprises a lower metal connection element 443, arranged plumb with the biasing element 422 and the well 401. The lower metal connection element 443 is electrically connected to the biasing element 422 via one or more holes 432. The biasing element 421 is transversely isolated via isolation trenches 452 and 453. The biasing element 422 is transversely isolated via isolation trenches 451 and 452. The isolation trench 452 isolates the biasing elements 421 and 422.

The lower metal connection element 441 is connected to an upper metal connection element (not shown) via a hole (not shown). The lower metal connection element 443 is connected to an upper metal connection element 444 via a hole 434. The upper metal connection elements are introduced into the digital topography of the circuit during a routing step.

In order to obtain a PNNP topography, the PPNN standard cells of the transistors can be used, including those shown in the example in FIG. 1, and it can be envisaged to perform an automatic inversion of the doping types of the wells of the standard cells. Starting with the cell shown in FIG. 1, the cell shown in FIG. 2 is obtained.

Figure 2:
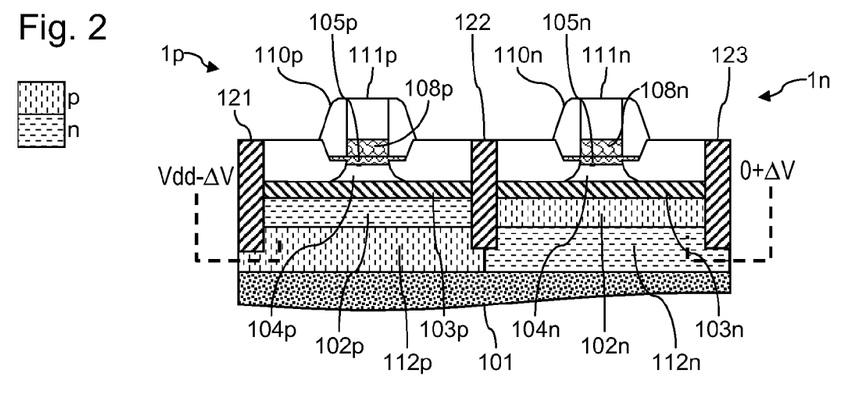
FIG. 2 is a cross-section view of a cell including transistors according to a PNNP topography.

The transistors 1n and 1p shown in FIG. 2 are implemented in FDSOI technology, according to a PNNP topography. The transistors 1n and 1p shown in FIG. 2 are identical to those shown in FIG. 1, except for the doping type of their well. The wells 112n and 112p have respective N-type and P-type dopings. The biasing connections of the wells 112p and 112n of the transistors shown in FIG. 1 are retained by retaining the connection between these wells and metal connection elements in higher levels. Standard cells of this type enable the ground plane 102p to be biased via the well 112p with a voltage Vdd-ΔV and the ground plane 102n to be biased via the well 112n with a voltage 0+ΔV, where ΔV>Vdd/2, since the voltage of the P-type doping well 112n is lower than the voltage of the well 112p. The creation of a directly biased diode junction between the well 112n and the well 112p is thus avoided.

The automatic inversion of the doping types of the standard cells for diodes protecting against antenna effects or standard cells of well tap cells is, on the other hand, unsuitable. If an inversion of the doping types is carried out automatically on cells such as those shown in FIG. 4 or 8 and on cells as shown in FIG. 1, the topography of the integrated circuit is non-functional at this stage. In fact, the functionality of the protection diodes is adversely affected, and the biases of the well tap cells are unsuitable. Following the inversion of the doping types, a place and route step should again be carried out to solve these design problems.

Figure 11:
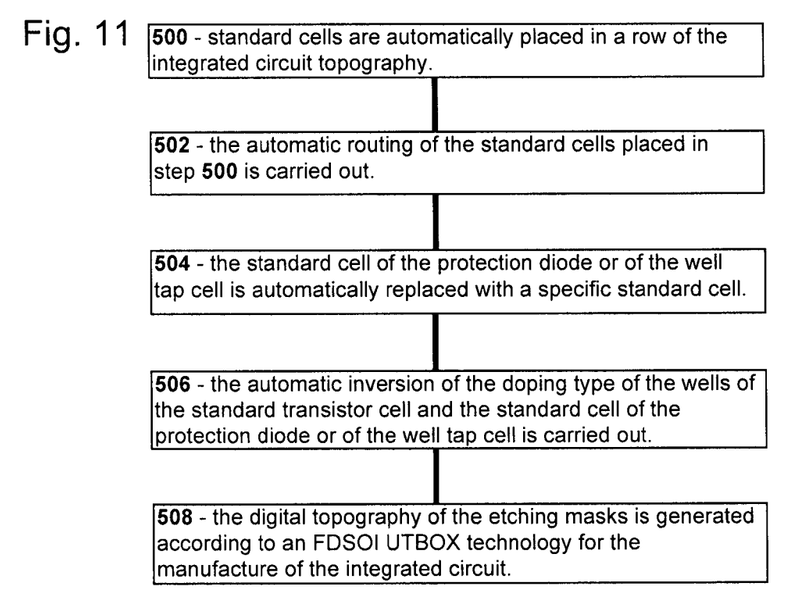
FIG. 11 is a flowchart of an example embodiment of a method for generating a digital integrated circuit topography according to the invention.

FIG. 11 shows a flowchart of different steps of the generation of a digital integrated circuit topography according to one embodiment of the invention.

During a step 500, standard cells are automatically placed in a row of the integrated circuit topography. These standard cells include at least one transistor cell (as shown in FIG. 1) and one protection diode cell (as shown in FIG. 4) or a well tap cell (as shown in FIG. 8) according to a PPNN topography. The standard cells of the protection diode or of the well tap cell comprise at least one lower metal connection element.

During a step 502, the automatic routing of the standard cells placed in step 500 is carried out, the routing including:
the creation of an upper metal connection element plumb with the lower metal connection element;
the creation of an interconnection between the lower metal connection element and the upper metal connection element.

During a step 504, the standard cell of the protection diode or of the well tap cell is automatically replaced with a specific standard cell. The specific standard cell comprises wells having the same types of doping as the standard cell that it replaces. Consequently, the specific standard cell comprises a P-type doping well arranged in the alignment of the P-type doping well of the nMOS transistor and comprises an N-type doping well arranged in the alignment of the N-type doping well of the pMOS transistor. In this specific standard cell, at least one lower metal connection element extends on either side of the axis of the row. This lower metal connection element is interconnected to the N-type doping well of the specific cell and remains interconnected with the upper metal connection element.

During a step 506, the automatic inversion of the doping type of the wells of the standard transistor cell and the standard cell of the protection diode or of the well tap cell is carried out.

During a step 508, the digital topography of the etching masks is generated according to an FDSOI UTBOX technology for the manufacture of the integrated circuit.

Figure 5A:
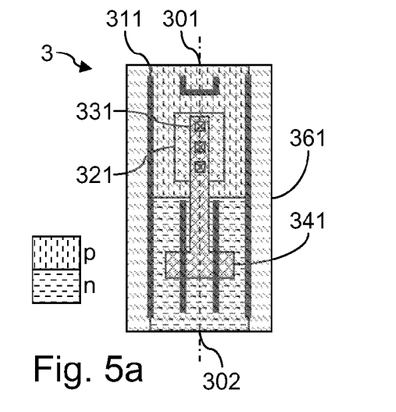
FIGS. 5a and 5b are top views of a standard cell of a protection diode for a PNNP topography according to one embodiment of the invention.
Figure 5B:
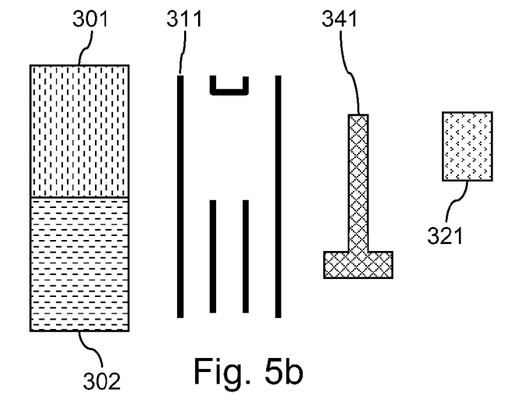
Figure 6:
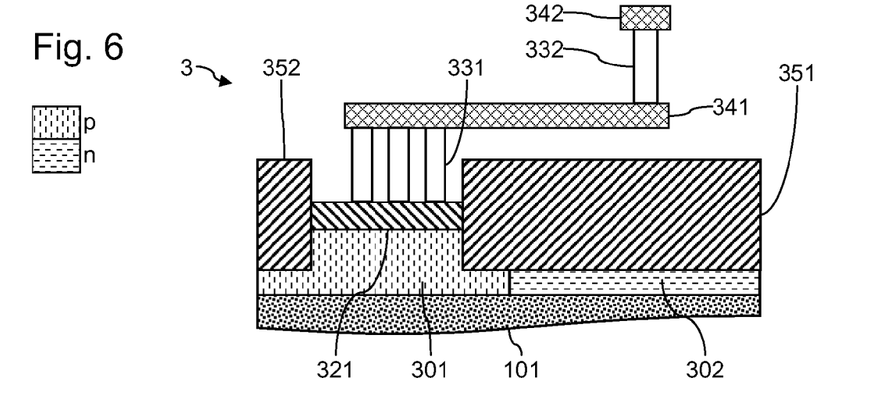
FIG. 6 is a cross-section side view of the standard cell shown in FIG. 5.

FIG. 5a shows a top view of a standard cell of a protection diode 3 according to a PNNP topography, following inversion of the doping type of the wells. A standard cell of this type therefore differs from the specific standard cell used for the replacement of the standard cell shown in FIG. 4 only in terms of the doping type of its wells. FIG. 5b shows a top view of different layers of a standard cell of this type. FIG. 6 is a cross-section view of a standard cell of this type. A standard cell of this type is intended to adjoin a standard transistor cell as shown in FIG. 2.

The standard diode cell 3 thus comprises a P-type doping well 301 and an N-type doping well 302. The well 301 is in contact with the well 302 on an axis corresponding to the axis of a row of standard cells. The patterns 311 correspond to polysilicon. A biasing element 321 is arranged plumb with the well 301 and forms an electrical connection with this well 301. The biasing element 321 comprises an N-type doping layer (arranged more or less at the same depth as the ground plane of an adjacent transistor and having a doping typically higher than that of this ground plane). The biasing element 321 may also comprise an upper layer of NiSi to carry out a silicidation step. The standard cell 3 also comprises a lower metal connection element 341. The lower metal connection element 341 extends on either side of the axis of the row. The lower metal connection element 341 is interconnected to the P-type doping well 301 via one or more holes 331. The element 341 is interconnected to the upper metal connection element 342 via a hole 332, the element 342 and the hole 332 having been defined during a prior routing step.

In order to enable the implementation of an automation of the inversion of the doping type of the wells 301 and 302, the specific standard cell of the protection diode 3 comprises a marker. This marker is implemented here in the form of a marking layer 361. When a script for inverting the doping type of the wells is run, the identification of a marker of this type indicates to the script that the doping type of the wells of the cell must be inverted.

Figure 9A:
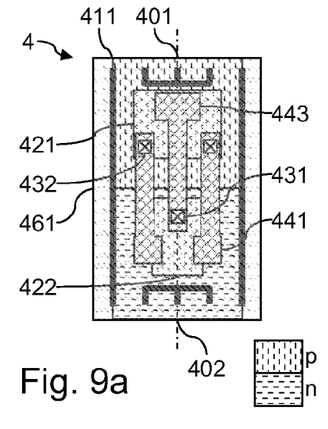
FIGS. 9a and 9b are top views of a standard cell of a well tap cell for a PNNP topography according to one embodiment of the invention.
Figure 9B:
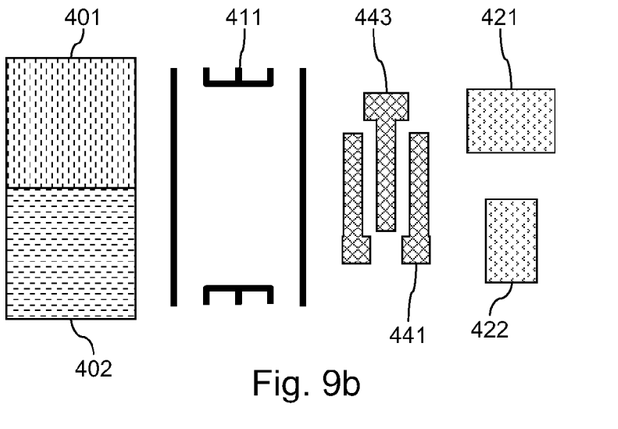
Figure 10:
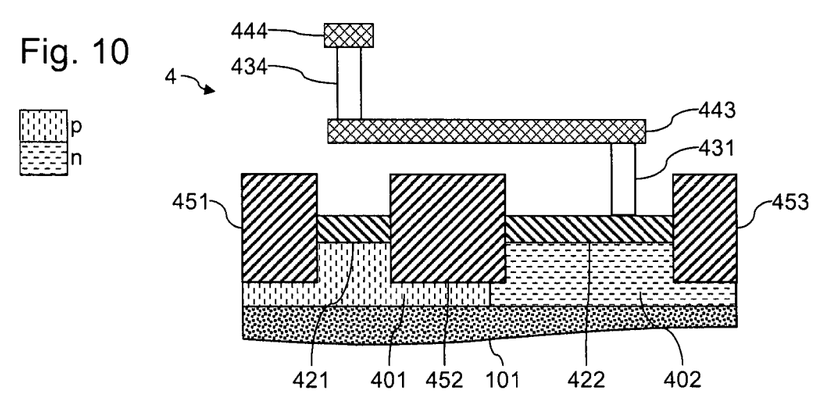
FIG. 10 is a cross-section side view of the standard cell shown in FIG. 9.

FIG. 9a shows a top view of a standard cell of a well tap cell according to a PNNP topography, following inversion of the doping type of the wells. FIG. 9b shows a top view of different layers of a standard cell of this type. A standard cell of this type therefore differs from the specific standard cell used for the replacement of the standard cell shown in FIG. 6 only in terms of the doping type of its wells. FIG. 10 is a cross-section view of a standard cell of this type. A standard cell of this type is intended to be coupled to a standard transistor cell as shown in FIG. 2.

The standard cell of well tap cells 4 thus comprises a P-type doping well 401 and an N-type doping well 402. The well 401 is in contact with the well 402 on an axis corresponding to the axis of a row of standard cells. The patterns 411 correspond to polysilicon. A biasing element 421 is arranged plumb with the well 401 and forms an electrical connection with this well 401. A biasing element 422 is arranged plumb with the well 402 and forms an electrical connection with this well 402. The biasing element 421 comprises an N-type doping layer (arranged more or less at the same depth as the ground plane of an adjacent transistor and having a doping typically higher than that of this ground plane). The biasing element 421 may also comprise an upper layer of NiSi to carry out a silicidation step. The biasing element 422 comprises an N-type doping layer (arranged more or less at the same depth as the ground plane of an adjacent transistor and having a doping typically higher than that of this ground plane). The biasing element 422 may also comprise an upper layer of NiSi to carry out a silicidation step.

The standard cell 4 also comprises a lower metal connection element 441. The lower metal connection element 441 extends on either side of the axis of the row. The lower metal connection element 441 is interconnected to the P-type doping well 401 via one or more holes 432. The element 441 is interconnected to an upper metal connection element (not shown) via a hole (not shown).

The standard cell 4 also comprises a lower metal connection element 443. The lower metal connection element 443 extends on either side of the axis of the row. The lower metal connection element 443 is interconnected to the N-type doping well 402 via one or more holes 433. The element 443 is interconnected to an upper metal connection element 444 via a hole 434, the element 444 and the hole 434 having been defined during a prior routing step.

In order to enable the implementation of an automation of the inversion of the doping type of the wells 401 and 402, the specific standard cell of the well tap cell 4 comprises a marker. This marker is implemented here in the form of a marking layer 461. When a script for inverting the doping type of the wells is run, the identification of a marker of this type indicates to the script that the doping type of the wells of the cell must be inverted.

The layers corresponding to an FDSOI UTBOX technology are present in the standard transistor cells placed in step 500 of the example. The layers corresponding to an FDSOI UTBOX technology can also be introduced only during step 508, if the standard transistor cells placed during step 500 correspond to a Bulk technology.

In order to implement the automatic inversion of the doping type of the wells of the standard transistor cells during step 506, it will be possible to introduce a corresponding marker into these standard cells, for example during step 500. As in the case of the protection diode cells and well tap cells, a marker of this type can be implemented in the form of a layer integrated into the standard cell.

The invention enables the simple design of integrated circuits combining both a circuit part with a PNNP topography having an optimized speed, and a circuit part with a PPNN topography having an optimized power consumption. The digital topography of the integrated circuit can be implemented in any suitable digital file format.

The invention obviously applies to all types of logic circuits, notably logic gates and SRAM memories.

The invention claimed is:

1. A method for generating a digital integrated circuit topography, said method comprising: automatically placing standard cells in a row of a topography of said integrated circuit, said standard cells comprising a first standard cell and a second standard cell, wherein said first standard cell includes an nMOS transistor disposed plumb with a P-type doping well, and a pMOS transistor disposed plumb with an N-type doping well, said P-type well and said N-type well being arranged on either side of an axis of said row, and wherein said second standard cell includes one of a diode protecting against antenna effects and a well tap cell, said second standard cell comprising a P-type doping well arranged in an alignment of said P-type well of said nMOS transistor and comprising an N-type doping well arranged in an alignment of said N-type well of said pMOS transistor, said second standard cell comprising a lower metal connection element coupled to said P-type doping well thereof, automatically routing said standard cells, wherein automatically routing comprises creating an interconnection between said lower metal connection element and an upper metal connection element arranged plumb with said lower metal connection element, replacing said second standard cell with a third standard cell comprising a P-type doping well arranged in said alignment of said P-type well of said nMOS transistor and comprising an N-type doping well arranged in said alignment of said N-type well of said pMOS transistor, said third cell comprising a lower metal connection element extending on either side of said axis and coupled to said N-type doping well and coupled to said upper metal connection element, automatically inverting said doping type of said wells of said first and third standard cells, and generating a digital topography of etching masks for manufacture of a Fully Depleted Silicon On Insulator (FDSOI) UTBOX integrated circuit including said first and third standard cells having been subjected to said automatic doping inversion.

2. The method of claim 1, wherein generating said digital topography comprises generating etching masks for formation of an UTBOX insulating layer under said nMOS and pMOS transistors and for formation of respective ground planes between said layer of insulator and said wells of said nMOS and pMOS transistors, a doping type of each of these ground planes being opposite of a doping type of said well of its transistor.

3. The method of claim 1, wherein said first and second standard cells are FDSOI UTBOX type.

4. The method of claim 1, wherein said second standard cell is a well tap cell comprising a different lower metal connection element interconnected to an N-type doping well thereof, wherein automatically routing comprises creating an interconnection between said different lower metal connection element and a different upper metal connection element arranged plumb with said different lower metal connection element, and wherein said third replacement cell comprises a different lower metal element extending on either side of said axis and interconnected to said P-type doping well and interconnected to said upper metal connection element.

5. The method of claim 1, wherein said second standard cell is a protection diode.

6. The method of claim 1, wherein automatically inverting said doping type of said wells is preceded by including an automatic inversion marker in said first and third standard cells.

7. The manufacture made according to the method of claim 1 comprising an integrated circuit including first and second FDSOI UTBOX cells arranged in a row, wherein said first cell includes an nMOS transistor arranged plumb with and above a ground plane and an N-type doping well, and a pMOS transistor arranged plumb with and above a ground plane and a P-type doping well, said N-type well and said P-type well being arranged on either side of an axis of said row, wherein said second cell includes one of a diode protecting against antenna effects and a well tap cell, said second cell comprising a P-type doping well arranged in said alignment of said P-type well of said pMOS transistor and comprising an N-type doping well arranged in said alignment of said N-type well of said nMOS transistor, said second cell comprising a lower metal connection element coupled to its P-type doping well and coupled to a higher-level metal connection element arranged plumb with said N-type doping well, said lower metal connection element extending on either side of said axis.

8. The manufacture of claim 7, further comprising a biasing circuit configured to apply a voltage to said N-doped well of said nMOS transistor and to apply a voltage to said P-doped well of said pMOS transistor, said voltage applied to said N-doped well being higher than said voltage applied to said P-doped well.

9. The manufacture of claim 7, wherein said nMOS transistor has a P-type doping, and wherein said ground plane of said pMOS transistor has an N-type doping.

10. The manufacture of claim 7, wherein said lower metal connection element is coupled to said P-type doping well by a via and by an N-type doping layer and of which said doping level is higher than that of said ground planes of said nMOS and pMOS transistors.

* * * * *